(12) United States Patent
Yatsuda

(10) Patent No.: US 10,840,359 B2
(45) Date of Patent: Nov. 17, 2020

(54) METHOD OF FORMING FINFET SOURCE/DRAIN CONTACT

(71) Applicant: TOKYO ELECTRON LIMITED, Tokyo (JP)

(72) Inventor: Koichi Yatsuda, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/087,574

(22) PCT Filed: Jun. 27, 2016

(86) PCT No.: PCT/JP2016/068981
§ 371 (c)(1),
(2) Date: Sep. 21, 2018

(87) PCT Pub. No.: WO2017/163438
PCT Pub. Date: Sep. 28, 2017

(65) Prior Publication Data
US 2019/0109205 A1   Apr. 11, 2019

(30) Foreign Application Priority Data
Mar. 24, 2016 (JP) .................. 2016-059716

(51) Int. Cl.
*H01L 21/768* (2006.01)
*H01L 29/66* (2006.01)
(Continued)

(52) U.S. Cl.
CPC .... *H01L 29/6681* (2013.01); *H01L 21/28158* (2013.01); *H01L 21/3086* (2013.01);
(Continued)

(58) Field of Classification Search
CPC ............... H01L 29/6681; H01L 29/511; H01L 21/28158; H01L 29/517; H01L 29/7851;
(Continued)

(56) References Cited

U.S. PATENT DOCUMENTS 9,190,489 B1 * 11/2015 Mountsier ......... H01L 21/02175
2011/0053381 A1 * 3/2011 Kobayashi ........ H01J 37/32192
438/726
(Continued)

FOREIGN PATENT DOCUMENTS

JP  2011-258842 A  12/2011
JP  2013-143398 A   7/2013
(Continued)

OTHER PUBLICATIONS

International Search Report dated Aug. 9, 2016 for International Application No. PCT/JP2016/06898 4 pages.

*Primary Examiner* — Selim U Ahmed
(74) *Attorney, Agent, or Firm* — Rothwell, Figg, Ernst & Manbeck, P.C.

(57) ABSTRACT

A method for manufacturing a semiconductor device includes: a first insulating film forming step of forming a first insulating film in a transistor having a structure in which a source and a drain raised in a fin shape are covered with a gate; a sacrifice film forming step of forming a sacrifice film; a hard mask pattern forming step of forming a hard mask film having a desired pattern; a first opening forming step of forming a first opening; a second insulating film forming step of forming a second insulating film made of a material different from the first insulating film, in the first opening; a second opening forming step of forming a second opening by removing the sacrifice film, after the second insulating film forming step; and a contact plug forming step of forming a contact plug in the second opening.

8 Claims, 14 Drawing Sheets

(51) Int. Cl.
  *H01L 29/78* (2006.01)
  *H01L 21/28* (2006.01)
  *H01L 21/308* (2006.01)
  *H01L 29/51* (2006.01)

(52) U.S. Cl.
  CPC ...... *H01L 21/76897* (2013.01); *H01L 29/511* (2013.01); *H01L 29/517* (2013.01); *H01L 29/518* (2013.01); *H01L 29/78* (2013.01); *H01L 29/7851* (2013.01)

(58) Field of Classification Search
  CPC ........... H01L 21/76897; H01L 21/3086; H01L 29/518; H01L 29/78
  See application file for complete search history.

(56) References Cited

U.S. PATENT DOCUMENTS

| | | | |
|---|---|---|---|
| 2013/0237050 A1* | 9/2013 | Kikutani | H01L 27/11573 438/618 |
| 2015/0069532 A1* | 3/2015 | Xie | H01L 29/66545 257/410 |
| 2015/0348794 A1* | 12/2015 | Kim | H01L 21/324 438/703 |
| 2016/0315191 A1* | 10/2016 | Tsai | H01L 29/7834 |

FOREIGN PATENT DOCUMENTS

| | | |
|---|---|---|
| JP | 2014-531770 A | 11/2014 |
| JP | 2015-228502 A | 12/2015 |
| JP | 5838530 B1 | 1/2016 |
| WO | 2009/099252 A | 6/2011 |

* cited by examiner

METHOD OF FORMING FINFET SOURCE/DRAIN CONTACT

CROSS REFERENCE TO RELATED APPLICATION

This application is a 35 U.S.C. 371 National Phase Entry Application from PCT/JP2016/068981, filed Jun. 27, 2016, which claims priority to Japanese Patent Application No. 2016-059716, filed Mar. 24, 2016, the disclosures of which are incorporated herein in their entirety by reference, and priority is claimed to each of the foregoing.

TECHNICAL FIELD

The present disclosure relates to a method for manufacturing a semiconductor device.

BACKGROUND

In the related art, there has been known a fin-field effect transistor (FinFET) having a structure in which a source and a drain raised in a fin shape are covered with a gate from left and right (two) directions, or left, right, and top (three) directions.

In the FinFET, a part of an insulating film, such as, for example, a pre-metal dielectric (PMD) film formed on the source and the drain is opened by etching and, a contact plug is formed at the opened portion so that the source and the drain are electrically connected to a wiring layer. However, according to the miniaturization of a pattern, in some cases, a positional shift may occur due to an exposure accuracy or resolution, and then it may be difficult to form an opening at a desired position.

Therefore, before the PMD film is formed, a method called a self-aligned contact (SAC) is used in which a gate is covered with an insulating film made of a material different from the PMD film, and an opening is formed by high selectivity ratio etching (see, e.g., Patent Document 1).

PRIOR ART DOCUMENT

Patent Document

Patent Document 1: Japanese Patent Laid-open Publication No. 2014-531770

SUMMARY

According to one aspect of the present disclosure, a method for manufacturing a semiconductor device includes: a first insulating film forming step of forming a first insulating film to cover at least a part of a surface of a gate in a transistor having a structure in which a source and a drain raised in a fin shape are covered with the gate; a sacrifice film forming step of forming a sacrifice film on the first insulating film; a hard mask pattern forming step of forming a hard mask film having a desired pattern on the sacrifice film; a first opening forming step of forming a first opening by removing a part of the sacrifice film by using the hard mask film as an etching mask; a second insulating film forming step of forming a second insulating film made of a material different from the first insulating film, in the first opening; a second opening forming step of forming a second opening by removing the sacrifice film, at a position where at least a part of the source or the drain is electrically connected to the wiring layer, after the second insulating film forming step; and a contact plug forming step of forming a contact plug in the second opening.

DETAILED DESCRIPTION

Figure 1:
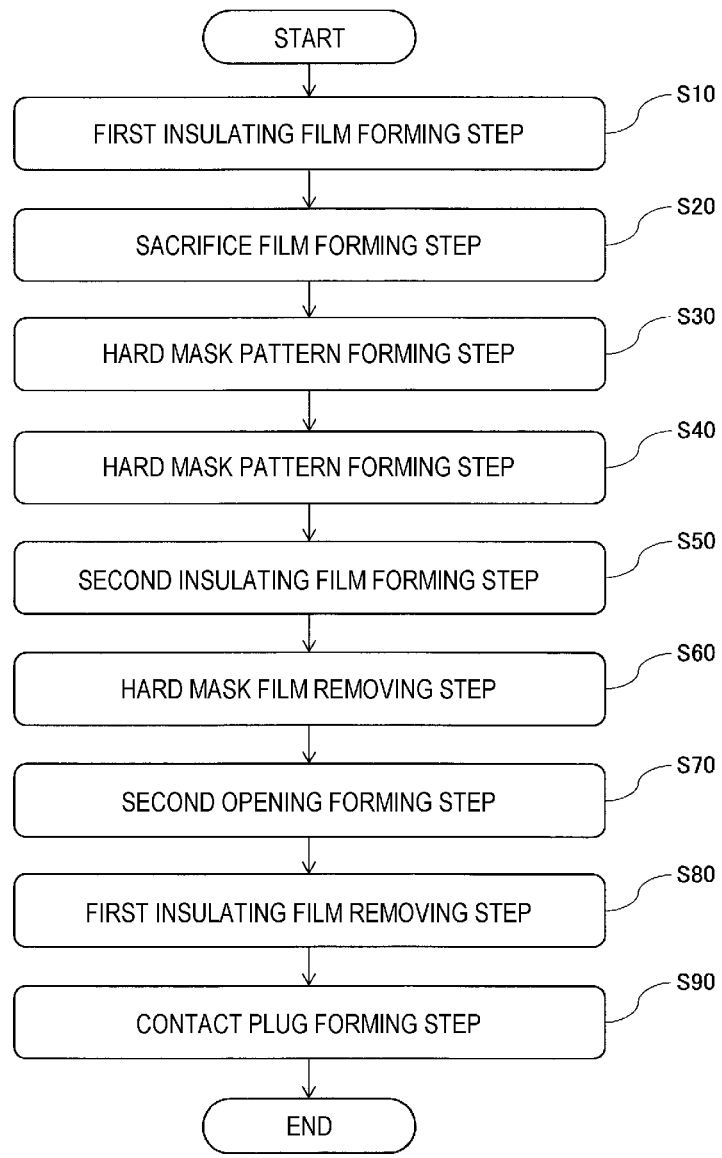
FIG. 1 is a flow chart illustrating an example of a manufacturing method of a semiconductor device of the present embodiment.

In the method of Japanese Patent Laid-open Publication No. 2014-531770, when the opening is formed by high selectivity ratio etching, a part of the insulating film covering the gate may be etched in some cases. When a part of the insulating film covering the gate is etched in this manner, since a distance between wirings in the contact plug formed in the opened portion and the gate is shortened, an increase of a leakage current or a short circuit occurs between wirings in the contact plug and the gate.

Thus, there is a demand for a manufacturing method of a semiconductor device, by which it is possible to suppress a leakage current or a short circuit.

According to the disclosed method for manufacturing a semiconductor device, a leakage current or a short circuit may be suppressed.

Hereinafter, modes for carrying out the present invention will be described with reference to drawings. Meanwhile, in the present specification and drawings, substantially the same components will be denoted by the same reference numerals and redundant descriptions thereof will be omitted.

Hereinafter, a case where as a semiconductor device, a FinFET is manufactured having a structure in which a source and a drain raised in a fin shape are covered with a gate from left, right, and top (three) directions will be described as an example, but the present disclosure is not limited to such a mode. The semiconductor device may be, for example, a FinFET having a structure in which a source and a drain raised in a fin shape are covered with a gate from left and right (two) directions.

In a method of manufacturing a semiconductor device of the present embodiment, first, a sacrifice film is formed at a position where a contact plug that electrically connects a source and a drain raised in a fin shape to a wiring layer is to be formed, and an insulating film made of a material different from the sacrifice film is formed at a position where the contact plug is not to be formed. Then, in a state where the insulating film is caused to remain, the sacrifice film is removed, and the contact plug is formed in a portion from which the sacrifice film is removed. Accordingly, a FinFET in which a desired source and a drain (hereinafter, also referred to as a "source/drain region") are electrically connected to a wiring layer via a contact plug may be manufactured, and a leakage current or a short circuit may be suppressed. The reason the leakage current or the short circuit may be suppressed will be described below.

Hereinafter, a method of manufacturing a semiconductor device of the present embodiment will be described in detail. FIG. 1 is a flow chart illustrating an example of a manufacturing method of a semiconductor device of the present embodiment. FIGS. 2 to 10 are process sectional views illustrating an example of the manufacturing method of the semiconductor device of the present embodiment. Meanwhile, in FIGS. 2 to 10, illustration of a source/drain region is omitted.

As illustrated in FIG. 1, the manufacturing method of the semiconductor device of the present embodiment includes a first insulating film forming step S10, a sacrifice film forming step S20, a hard mask pattern forming step S30, a first opening forming step S40, a second insulating film forming step S50, a hard mask film removing step S60, a second opening forming step S70, a first insulating film removing step S80, and a contact plug forming step S90.

Figure 2:
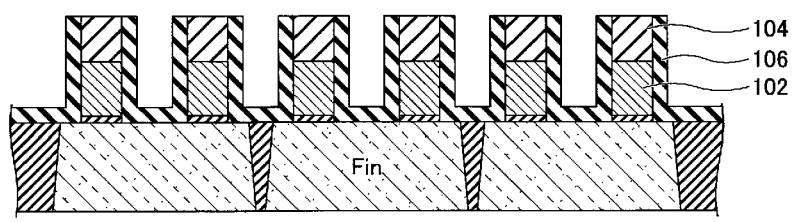
FIG. 2 is a process diagram (1) illustrating an example of the manufacturing method of the semiconductor device of the present embodiment.

First, as illustrated in FIG. 2, a first insulating film 106 is formed to cover at least a part of a surface of a gate 102 in a transistor having a structure in which a source and a drain raised in a fin shape are covered with the gate 102 from left, right, and top (three) directions (the first insulating film forming step S10). In FIG. 2, the first insulating film 106 is formed on both side surfaces of the gate 102. A cap dielectric film 104 is formed on the top surface of the gate 102. Meanwhile, in FIG. 2, the first insulating film 106 is not formed on the top surface of the cap dielectric film 104, but the first insulating film 106 may be formed on the top surface of the cap dielectric film 104.

The first insulating film 106 is an insulating film that prevents the gate 102 from being etched when an opening for a contact plug 120 electrically connecting a source/drain region to a wiring layer is formed, and is a contact etch stop layer (CESL). It is desirable that the first insulating film 106 is, for example, a silicon nitride film (SiN film). Meanwhile, the contact plug 120 will be described below.

A method of forming the first insulating film 106 is not particularly limited, but may be arbitrarily selected according to, for example, a material or a film thickness of a film to be formed. When the first insulating film 106 is a SiN film, for example, chemical vapor deposition (CVD) may be used. Atomic layer deposition (ALD) or molecular layer deposition (MDL) may also be used.

Figure 3:
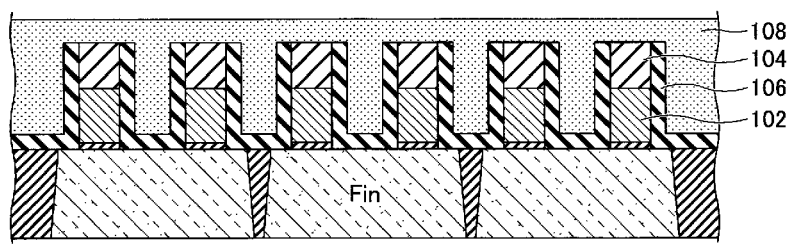
FIG. 3 is a process diagram (2) illustrating an example of the manufacturing method of the semiconductor device of the present embodiment.

Next, as illustrated in FIG. 3, a sacrifice film 108 is formed on the first insulating film 106 formed in the first insulating film forming step S10 (the sacrifice film forming step S20).

The sacrifice film 108 is a film that will be removed in the second opening forming step S70 to be described below, and is, for example, a dummy plug. The sacrifice film 108 is a film made of a material different from the first insulating film 106 and is desirably a film having a high etching selectivity with respect to the first insulating film 106 and a second insulating film to be described below. When the first insulating film 106 is a SiN film, for example, an SOC (spin on carbon) film, an amorphous silicon (a-Si) film, or an SOD (spin on dielectric) film may be used. Among them, from the viewpoint that there is a high etching selectivity particularly with respect to a SiN film, an SOC film is desirable.

After the sacrifice film 108 is formed, a flattening processing of flattening the top surface of the sacrifice film 108 may be performed. The method of the flattening processing is not particularly limited. However, when the sacrifice film 108 is an SOC film, for example, a method of irradiating the sacrifice film 108 with ultraviolet rays (UV) may be used. After the flattening processing, the sacrifice film 108 may be further formed on the flattened top surface of the sacrifice film 108.

Figure 4:
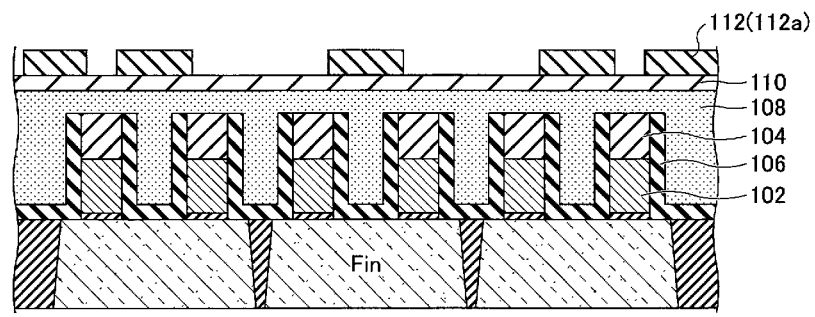
FIG. 4 is a process diagram (3) illustrating an example of the manufacturing method of the semiconductor device of the present embodiment.

Next, as illustrated in FIG. 4, a hard mask film 112 having a desired pattern is formed on the sacrifice film 108 formed in the sacrifice film forming step S20 (the hard mask pattern forming step S30).

Specifically, a protective film 110 formed of, for example, a SiN film is formed on the sacrifice film 108 formed in the sacrifice film forming step S20, and a hard mask pattern 112a, in which the hard mask film 112 is removed at a position where the contact plug 120 is not to be formed, is formed on the protective film 110. That is, since the hard mask pattern 112a is formed in which the hard mask film 112 is caused to remain at a position where the contact plug 120 to be described below is to be formed, the hard mask pattern 112a may be formed through a so-called one-dimensional (1D) layout in which after a line-and-space pattern (L&S pattern) is formed, a part of the line pattern is cut out. Thus, a margin of an edge placement error (EPE) increases. Meanwhile, details of a method of forming a desired pattern on the hard mask film 112 will be described below.

Figure 5:
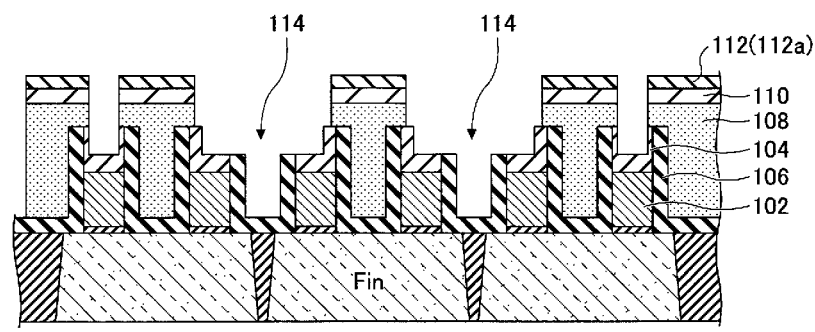
FIG. 5 is a process diagram (4) illustrating an example of the manufacturing method of the semiconductor device of the present embodiment.

Next, as illustrated in FIG. 5, the sacrifice film 108 is removed by using the hard mask film 112 having the desired pattern formed in the hard mask pattern forming step S30, as an etching mask, so that a first opening 114 is formed (the first opening forming step S40).

A method of removing the sacrifice film 108 is not particularly limited, and may be arbitrarily selected according to, for example, a material of a film to be removed. However, it is desirable to use, for example, reactive ion etching (RIE).

Figure 6:
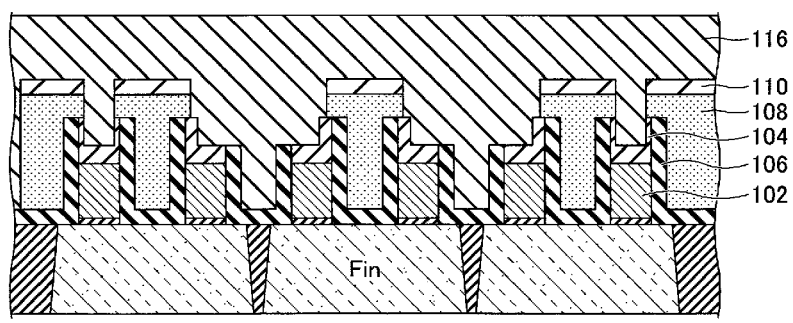
FIG. 6 is a process diagram (5) illustrating an example of the manufacturing method of the semiconductor device of the present embodiment.

Next, as illustrated in FIG. 6, a second insulating film 116 is formed in the first opening 114 formed in the first opening forming step S40 (the second insulating film forming step S50). Since the second insulating film 116 is formed in the first opening 114, even when a part of the first insulating film 106 is etched in the first opening forming step S40, the second insulating film 116 is newly formed in the etched portion. Thus, the etched portion may be prevented from becoming a path of a leakage current or a short circuit.

The second insulating film 116 is an insulating film formed above the source/drain region and is, for example, a PMD film. The second insulating film 116 is a film made of a material different from the first insulating film 106 and the sacrifice film 108, and is desirably a film having a high etching selectivity with respect to the sacrifice film 108. When the sacrifice film 108 is an SOC film, for example, an SOD film or a silicon oxide film ($SiO_2$ film) is desirable. When the sacrifice film 108 is an a-Si film, for example, an SOD film or a $SiO_2$ film is desirable. When the sacrifice film 108 is an SOD film, for example, a $SiO_2$ film is desirable.

Figure 7:
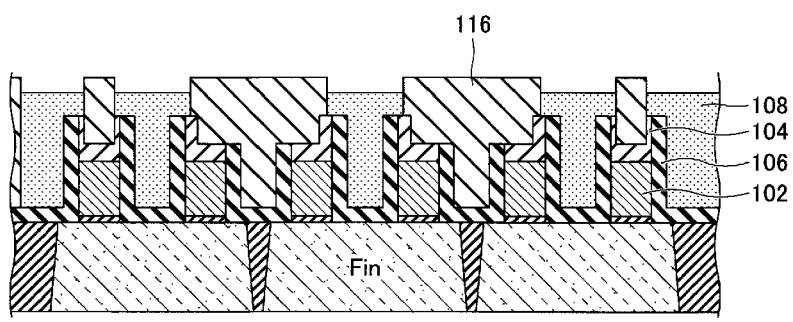
FIG. 7 is a process diagram (6) illustrating an example of the manufacturing method of the semiconductor device of the present embodiment.

Next, as illustrated in FIG. 7, after the second insulating film 116 is formed in the second insulating film forming step S50, the hard mask film 112 and the second insulating film 116 formed on the hard mask film 112 are removed (the hard mask film removing step S60).

A method of removing the hard mask film 112 is not particularly limited but, for example, chemical mechanical polishing (CMP), dry etching, or wet etching may be used. Specifically, the second insulating film 116 and the hard mask film 112 may be removed by performing polishing by, for example, CMP until the top surface of the sacrifice film 108 is exposed. After polishing by CMP is performed until the top surface of the hard mask film 112 is exposed, the hard mask film 112 may be removed by, for example, dry etching or wet etching. In the case where it is possible to remove the hard mask film 112 simultaneously with removal of the sacrifice film 108 in the second opening forming step S70 to be described below, the hard mask film removing step S60 may not be performed prior to the second opening forming step S70 and the hard mask film removing step S60 may be omitted.

Figure 8:
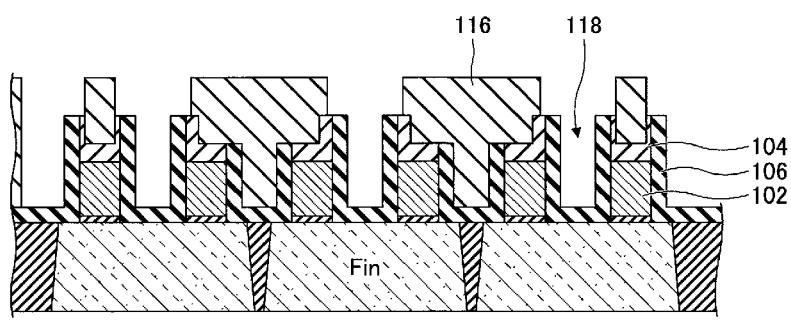
FIG. 8 is a process diagram (7) illustrating an example of the manufacturing method of the semiconductor device of the present embodiment.

Next, as illustrated in FIG. 8, after the hard mask film 112 is removed in the hard mask film removing step S60, the sacrifice film 108 is removed so that a second opening 118 is formed (the second opening forming step S70). Therefore, an opening (the second opening 118) is formed at a position where the source/drain region is electrically connected to the wiring layer.

A method of removing the sacrifice film 108 is not particularly limited, and may be arbitrarily selected according to, for example, materials of the sacrifice film 108 and the second insulating film 116.

In the case where the sacrifice film 108 is an SOC film, the first insulating film 106 is a SiN film, and the second insulating film 116 is an SOD film or a $SiO_2$ film, it is desirable to use, for example, ashing. When the SOC film is removed by ashing, since the SOC film has a high etching selectivity with respect to the SiN film, the SOD film and the $SiO_2$ film, the SiN film, the SOD film and the $SiO_2$ film are hardly shaved. That is, the first insulating film 106 and the cap dielectric film 104 are hardly shaved and the shapes may be maintained.

In the case where the sacrifice film 108 is an a-Si film, the first insulating film 106 is a SiN film, and the second insulating film 116 is an SOD film or a $SiO_2$ film, it is desirable to use, for example, dry etching using a gas containing chlorine or bromine. When the a-Si film is removed by dry etching using a gas containing chlorine or bromine, since the a-Si film has a high etching selectivity with respect to the SiN film, the SOD film and the $SiO_2$ film, the SiN film, the SOD film, and the $SiO_2$ film are hardly shaved. That is, the first insulating film 106 and the cap dielectric film 104 are hardly shaved and the shapes may be maintained.

In the case where the sacrifice film 108 is an SOD film, the first insulating film 106 is a SiN film, and the second insulating film 116 is a $SiO_2$ film, it is desirable to use, for example, wet etching. When the SOD film is removed by wet etching, since the SOD film has a high etching selectivity with respect to the SiN film and the $SiO_2$ film, the SiN film and the $SiO_2$ film are hardly shaped. That is, the first insulating film 106 and the cap dielectric film 104 are hardly shaved, and the shapes may be maintained.

Figure 9:
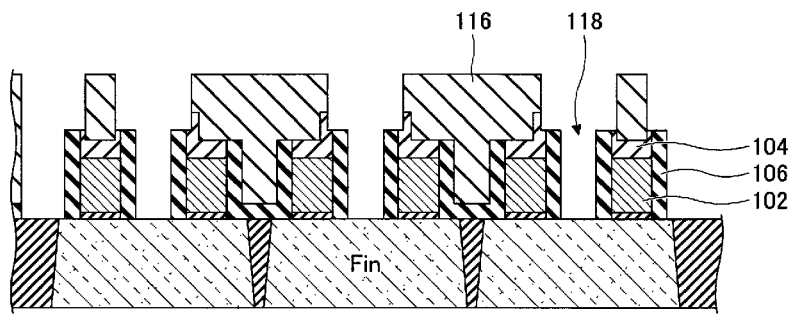
FIG. 9 is a process diagram (8) illustrating an example of the manufacturing method of the semiconductor device of the present embodiment.

Next, as illustrated in FIG. 9, the first insulating film 106 remaining on the bottom portion in the second opening 118 formed the second opening forming step S70 is removed (the first insulating film removing step S80). Accordingly, the source/drain region is exposed at the bottom portion of the second opening 118.

A method of removing the first insulating film 106 is not particularly limited, but it is desirable to use, for example, RIE. Although the first insulating film 106 and the cap dielectric film 104 on the top portion of the gate 102 are also partially shaved when the source/drain region is exposed at the bottom portion in the second opening 118, since the shapes of the first insulating film 106 and the cap dielectric film 104 are maintained in a step of forming the second opening 118 (the second opening forming step S70), a final shaving amount may be controlled. Accordingly, since a distance between wirings in the second opening 118 and the gate 102 is maintained, a leakage current or a short circuit may be suppressed between wirings in the contact plug 120 and the gate 102.

Figure 10:
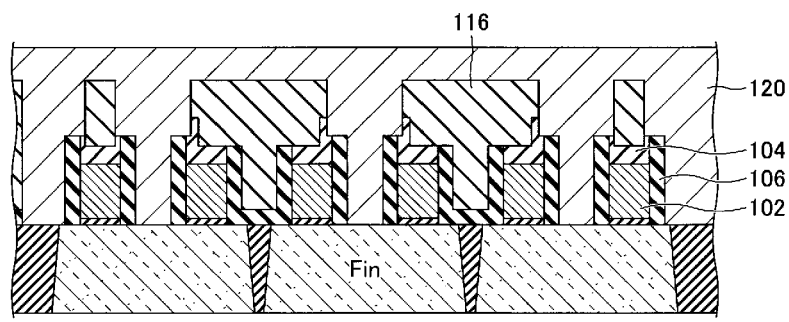
FIG. 10 is a process sectional view (9) illustrating an example of the manufacturing method of the semiconductor device of the present embodiment.

Next, as illustrated in FIG. 10, the contact plug 120 is formed in the second opening 118 formed in the second opening forming step S70 and the first insulating film removing step S80, in which the source/drain region is exposed at the bottom portion (the contact plug forming step S90).

The contact plug 120 is a film that electrically connects the source/drain region to the wiring layer, and is, for example, a conductive film. The conductive film is not particularly limited but it is desirable to use, for example, tungsten (W), copper (Cu), or polysilicon (Poly-Si).

A method of forming the contact plug 120 is not particularly limited, but may be arbitrarily selected according to, for example, a material of a conductive film. After a barrier metal film, such as, for example, a stacked film of a titanium nitride film (TiN film) and a titanium film (Ti film) is formed in the second opening 118, the contact plug 120 may be formed.

Through the above-described steps, a FinFET in which the desired source/drain region is electrically connected to the wiring layer may be manufactured.

Figure 11:
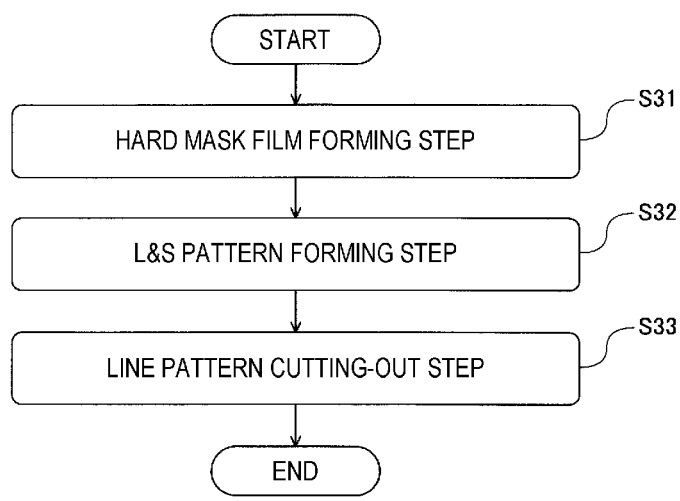
FIG. 11 is a flow chart illustrating an example of a hard mask pattern forming step.
Figure 12A:
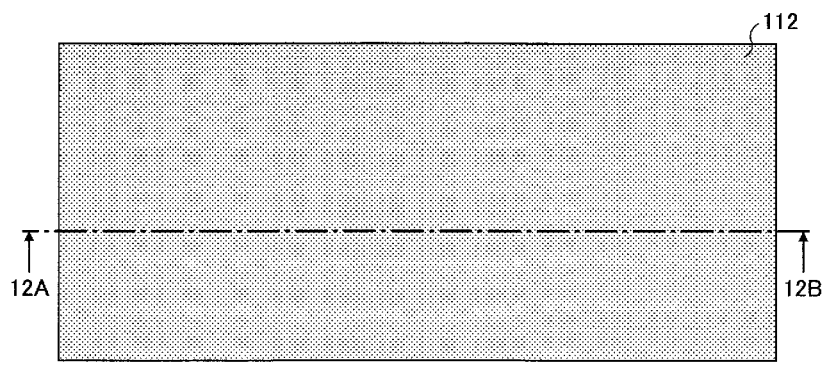
FIG. 12A is a process diagram (1) illustrating an example of the hard mask pattern forming step.
Figure 12B:
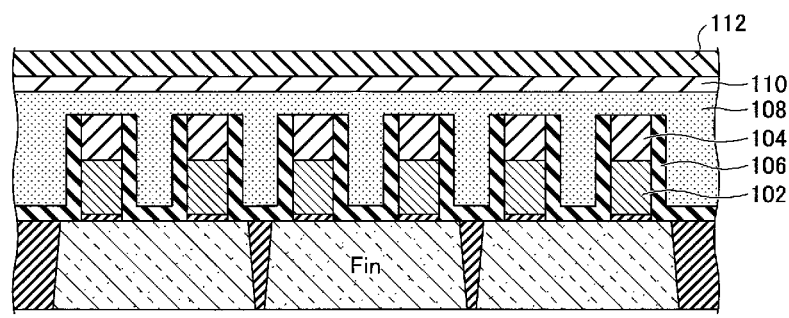
FIG. 12B is a process diagram (1) illustrating an example of the hard mask pattern forming step.
Figure 13A:
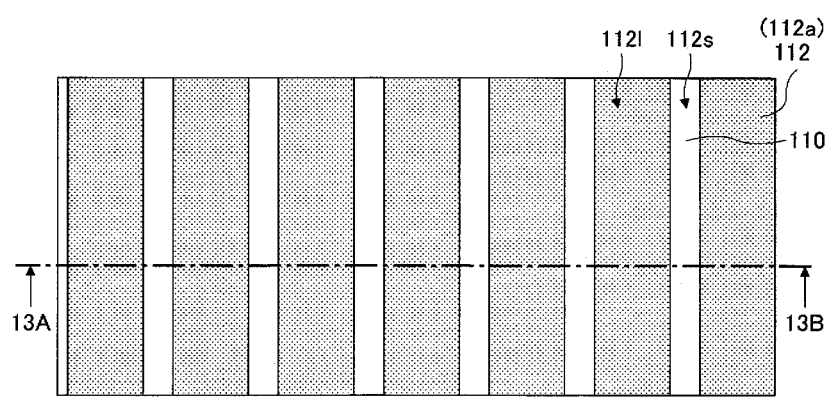
FIG. 13A is a process diagram (2) illustrating an example of the hard mask pattern forming step.
Figure 13B:
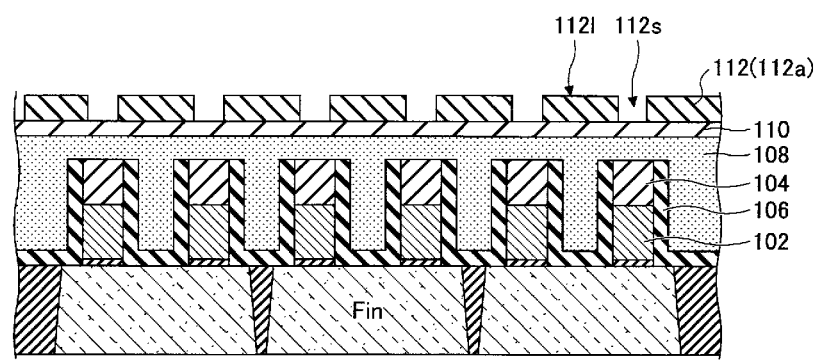
FIG. 13B is a process diagram (2) illustrating an example of the hard mask pattern forming step.
Figure 14A:
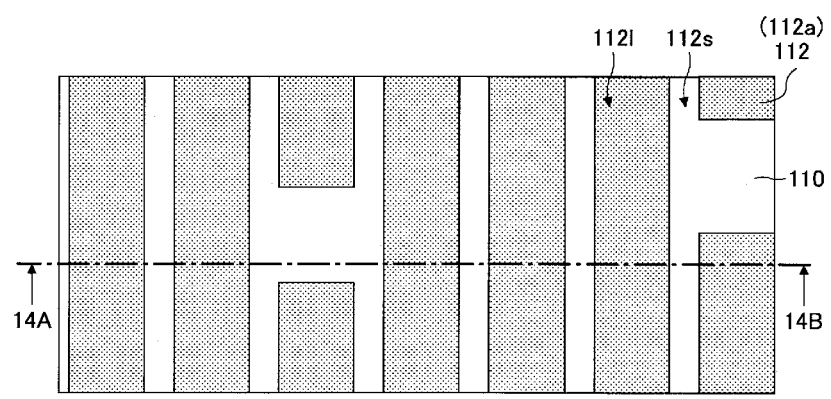
FIG. 14A is a process diagram (3) illustrating an example of the hard mask pattern forming step.
Figure 14B:
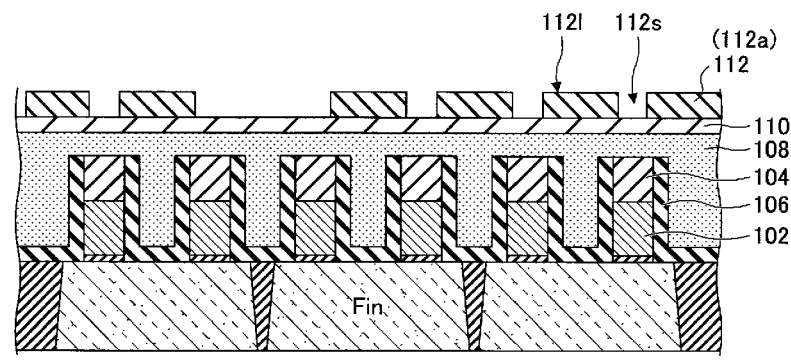
FIG. 14B is a process diagram (3) illustrating an example of the hard mask pattern forming step.
Figure 15A:
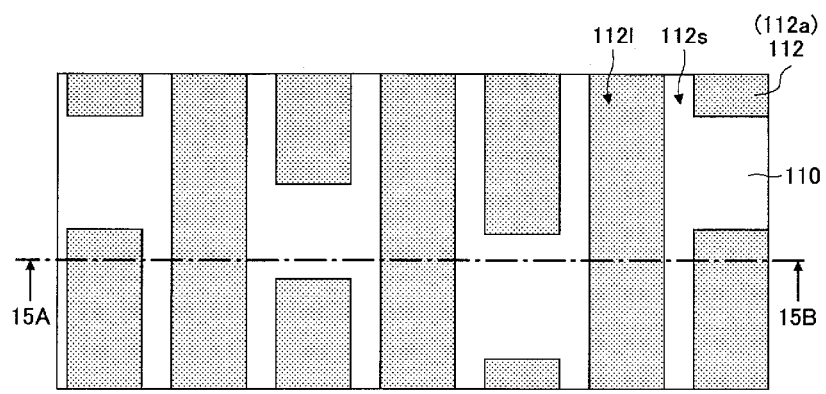
FIG. 15A is a process diagram (4) illustrating an example of the hard mask pattern forming step.
Figure 15B:
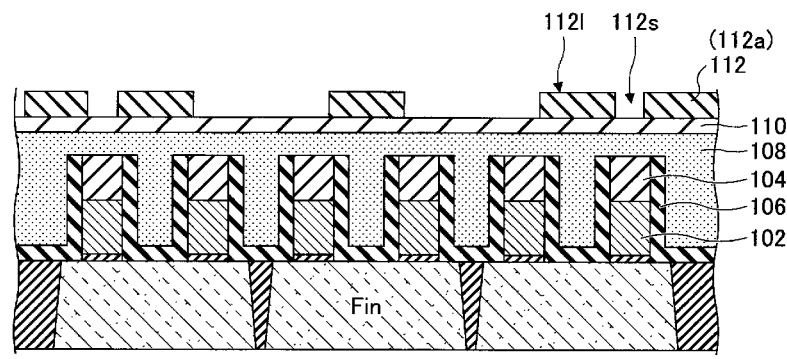
FIG. 15B is a process diagram (4) illustrating an example of the hard mask pattern forming step.

Next, a method of forming a desired pattern on the hard mask film 112 [the hard mask pattern forming step S30] will be described. FIG. 11 is a flow chart illustrating an example of the hard mask pattern forming step. FIGS. 12A to 15B are process diagrams illustrating an example of the hard mask pattern forming step. Meanwhile, FIG. 12A is a top view, and FIG. 12B is a sectional view taken along the dash-dotted line (12A-12B) in FIG. 12A. FIG. 13A is a top view, and FIG. 13B is a sectional view taken along the dash-dotted line (13A-13B) in FIG. 13A. FIG. 14A is a top view, and FIG. 14B is a sectional view taken along the dash-dotted line (14A-14B) in FIG. 14A. FIG. 15A is a top view, and FIG. 15B is a sectional view taken along the dash-dotted line (15A-15B) in FIG. 15A. Meanwhile, in FIGS. 12A to 15B, illustration of the source/drain region is omitted.

As illustrated in FIG. 11, the hard mask pattern forming step S30 includes a hard mask film forming step S31, an L&S pattern forming step S32, and a line pattern cutting-out step S33.

First, as illustrated in FIGS. 12A and 12B, the protective film 110 is formed on the sacrifice film 108 formed in the sacrifice film forming step S20 and, the hard mask film 112 is formed on the protective film 110 (the hard mask film forming step S31).

The hard mask film 112 only has to be a film that functions as an etching mask when the sacrifice film 108 is etched in the first opening forming step S40. When the sacrifice film 108 is an SOC film, a film such as, for example, a stacked film of a SiO$_2$ film and a SiN film, or a stacked film of a SiO$_2$ film and a TiN film, which has a high etching selectivity with respect to the SOC film, is desirable. When the sacrifice film 108 is an SOD film, a film such as, for example, a silicon film (Si film) or a TiN film, which has a high etching selectivity with respect to the SOD film, is desirable.

A method of forming the hard mask film 112 is not particularly limited, but may be arbitrarily selected according to, for example, a material or a film thickness of a film to be formed.

Next, as illustrated in FIGS. 13A and 13B, an L&S pattern is formed on the hard mask film 112 formed in the hard mask film forming step S31 (L&S pattern forming step S32).

Specifically, the hard mask film 112 is patterned such that a position corresponding to the source/drain region becomes a line pattern 1121, and a position corresponding to the gate 102 becomes a space pattern 112s.

A method of patterning the hard mask film 112 is not particularly limited, but it is possible to use, for example, a method of forming a resist pattern on the hard mask film 112, and etching the hard mask film 112 by using the resist pattern as an etching mask. The resist pattern is formed by, for example, photolithography such that a position corresponding to the source/drain region becomes a line pattern, and a position corresponding to the gate 102 becomes a space pattern. Meanwhile, when a pattern finer than the resolution limit of an exposure device is formed, the L&S pattern may be formed on the hard mask film 112 by self-aligned multiple patterning (SAMP).

Next, as illustrated in FIGS. 14A, 14B, 15A, and 15B, a part of the line pattern 1121 of the hard mask film 112 having the L&S pattern formed in the L&S pattern forming step S32 is cut out (the line pattern cutting-out step S33).

Specifically, in the line pattern 1121 of the hard mask film 112, a line pattern at a position where the contact plug 120 electrically connecting the source/drain region to the wiring layer is not to be formed is removed so that a part of the line pattern of the hard mask film 112 is cut out.

A method of cutting out a part of the line pattern is not particularly limited but it is possible to use a method of forming a cut mask on the hard mask film 112 by photolithography and etching the hard mask film 112 by using the cut mask as an etching mask. The cut mask is formed such that a position corresponding to a region to be cut out in the line pattern 1121 becomes an open pattern.

In the line pattern cutting-out step S33, when a pattern finer than, for example, the resolution limit of the exposure device is formed, a plurality of cut masks may be used. That is, the hard mask film 112 having the desired pattern is formed by using the plurality of cut masks. Specifically, as illustrated in FIGS. 14A and 14B, first, a first cut mask is formed on the hard mask film 112 and, a part of the line pattern 1121 of the hard mask film 112 having the L&S pattern is cut out by using the first cut mask as an etching mask. Subsequently, as illustrated in FIGS. 15A and 15B, another part of the line pattern of the hard mask film 112 having the L&S pattern is cut out by using a second cut mask different from the first cut mask, as an etching mask. Accordingly, the hard mask film 112 having a pattern finer than the resolution limit of the exposure device may be formed.

Meanwhile, in FIGS. 14A, 14B, 15A, and 15B, descriptions have been made on a mode where a part of the line pattern 1121 is cut out by using two different cut masks so as to form the hard mask film 112 having the desired pattern, but the present disclosure is not limited to such a mode. For example, three or more different cut masks may be used to cut out a part of the line pattern 1121 so as to form the hard mask film 112 having the desired pattern. One cut mask may be used to cut out a part of the line pattern 1121 so as to form the hard mask film 112 having the desired pattern.

Through the above-described steps, the hard mask film 112 having the desired pattern may be formed.

Next, descriptions will be made on operations and effects in the case where after the L&S pattern is formed, a part of the line pattern 1121 is cut out, thereby forming the hard mask film 112 having the desired pattern, with reference to FIGS. 16 to 19.

Figure 16:
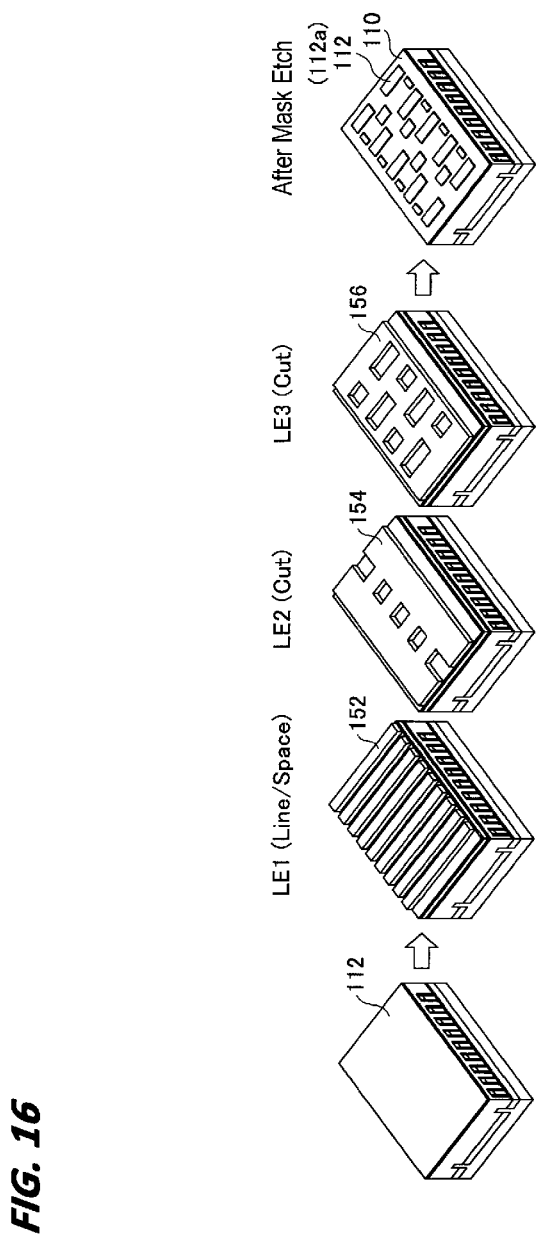
FIG. 16 is a view (1) for explaining operations and effects in the manufacturing method of the semiconductor device of the present embodiment.
Figure 17:
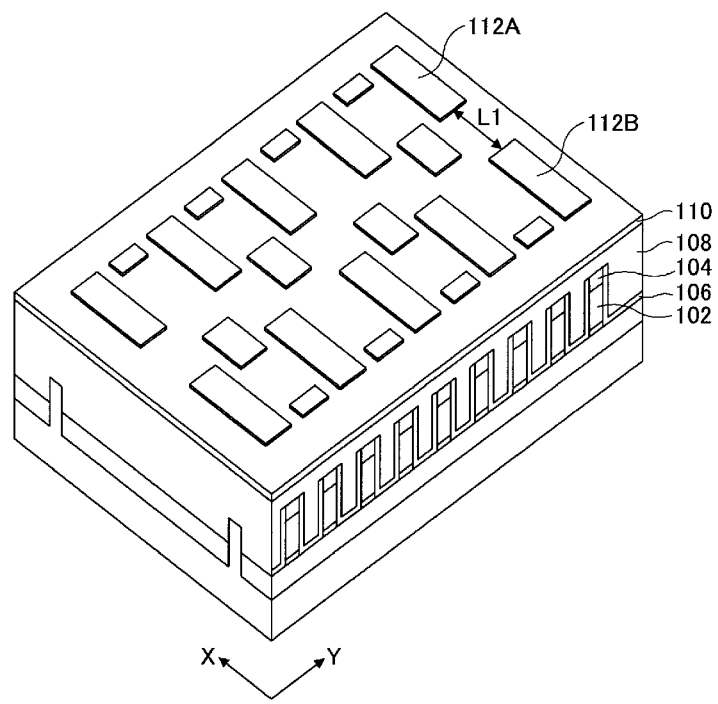
FIG. 17 is a view (2) for explaining operations and effects in the manufacturing method of the semiconductor device of the present embodiment.
Figure 18:
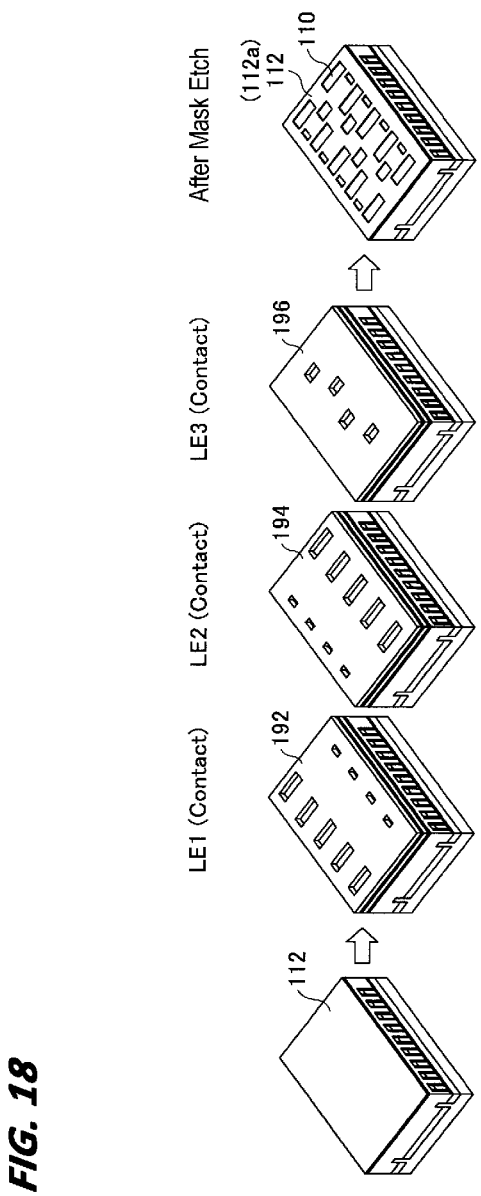
FIG. 18 is a view (3) for explaining operations and effects in the manufacturing method of the semiconductor device of the present embodiment.
Figure 19:
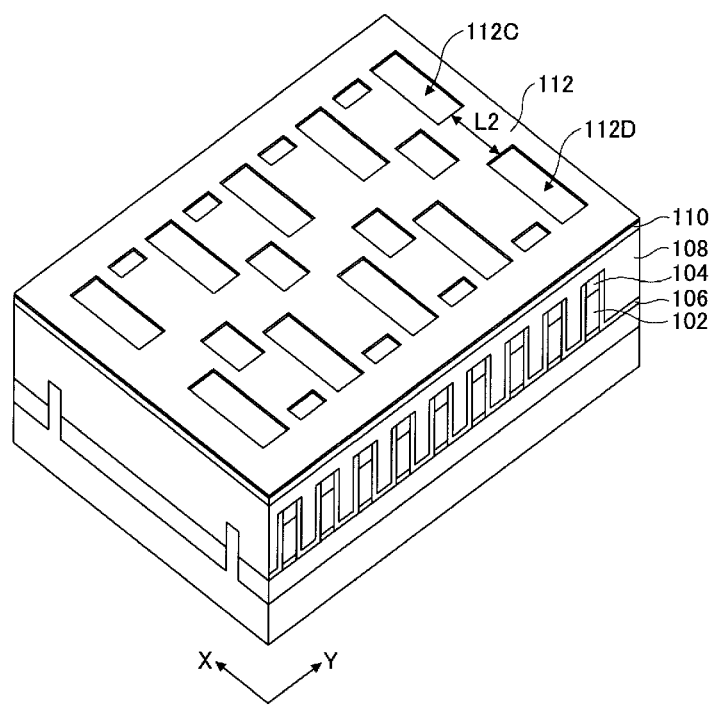
FIG. 19 is a view (4) for explaining operations and effects in the manufacturing method of the semiconductor device of the present embodiment.

FIGS. 16 to 19 are views for explaining operations and effects of the manufacturing method of the semiconductor device of the present embodiment. Specifically, FIG. 16 is a schematic perspective view for explaining the hard mask pattern forming step of the present embodiment, and FIG. 17 is a view for explaining a hard mask pattern obtained by the hard mask pattern forming step illustrated in FIG. 16. FIG. 18 is a schematic perspective view for explaining a conventional hard mask pattern forming step, and FIG. 19 is a view for explaining a hard mask pattern obtained by the hard mask pattern forming step illustrated in FIG. 18.

In the present embodiment, as described above, the hard mask film 112 is patterned such that the hard mask film 112 is removed at a position where the contact plug 120 is not to be formed and the hard mask film 112 is caused to remain at a position where the contact plug 120 is to be formed.

Specifically, as illustrated in FIG. 16, first, an L&S pattern is transferred to the hard mask film 112 by using an etching mask 152 having the L&S pattern on the hard mask film 112 (step LE1). Subsequently, a part of the line pattern 1121 of the hard mask film 112 formed in step LE1 is cut out by using a first cut mask 154 as an etching mask (step LE2). Subsequently, another part of the line pattern 1121 cut in step LE2 is cut out by using a second cut mask 156 different from the first cut mask 154, as an etching mask (step LE3). Accordingly, the hard mask pattern 112a is obtained in which the hard mask film 112 remains at a position where the contact plug 120 is to be formed.

However, there is a case where due to an influence of accuracy in positioning (alignment), the position of the etching mask used in each step such as step LE1, step LE2 and step LE3 is shifted. However, in the manufacturing method of the semiconductor device of the present embodiment, even when the position of the etching mask used in each step such as step LE1, step LE2 and step LE3 is shifted in the X direction, since as illustrated in FIG. 17, the hard mask films 112 adjacent in the X direction (for example, a hard mask film 112A and a hard mask film 112B in FIG. 17) are formed using one cut mask, the hard mask films 112 adjacent in the X direction have an unchanged distance L1 therebetween, and thus do not come in contact with each other. As a result, an EPE margin increases.

In contrast, conventionally, the hard mask film 112 is patterned such that the hard mask film 112 is removed at a position where the contact plug 120 is to be formed, and the hard mask film 112 is caused to remain at a position where the contact plug 120 is not to be formed.

Specifically, as illustrated in FIG. 18, a first opening pattern is transferred to the hard mask film 112 by using a first etching mask 192 having the first opening pattern (step LE1). Subsequently, a second opening pattern is transferred to the hard mask film 112 on which the first opening pattern is formed in step LE1, by using a second etching mask 194 having the second opening pattern different from the first opening pattern (step LE2). Subsequently, a third opening pattern is transferred to the hard mask film 112 on which the second opening pattern is formed in step LE2, by using a third etching mask 196 having the third opening pattern different from the first opening pattern and the second opening pattern (step LE3). Accordingly, the hard mask pattern 112a is obtained in which the hard mask film 112 is removed at a position where the contact plug 120 is to be formed.

Thus, in a conventional method, when the position of the etching mask used in each step such as step LE1, step LE2 and step LE3 is shifted in the X direction due to an influence of alignment accuracy, since as illustrated in FIG. 19, openings adjacent in the X direction (for example, an opening 112C and an opening 112D in FIG. 19) are formed using different etching masks, shifting in the X direction may be made, thereby reducing a distance L2 between openings adjacent in the X direction in some cases. As a result, an EPE margin decreases.

As described above, in the manufacturing method of the semiconductor device of the present embodiment, the sacrifice film 108 is formed at a position where the contact plug 120 that electrically connects the source and the drain raised in a fin shape to the wiring layer is to be formed, and the second insulating film 116 made of a material different from the sacrifice film 108 is formed at a position where the contact plug 120 is not to be formed. Then, in a state where the second insulating film 116 is caused to remain, the sacrifice film 108 is removed, and the contact plug 120 is formed in a portion from which the sacrifice film 108 is removed. Accordingly, a FinFET in which a desired source/drain region is electrically connected to a wiring layer may be manufactured, and a leakage current or a short circuit may be suppressed.

In the manufacturing method of the semiconductor device of the present embodiment, in the hard mask pattern forming step S30, the hard mask pattern 112a is formed in which the hard mask film 112 is removed at a position where the contact plug 120 is not to be formed. Thus, when the hard mask film 112 having the desired pattern is formed, the hard mask film 112 may be patterned through, for example, a so-called 1D layout in which an L&S pattern is formed, and a part of the line pattern is cut out. As a result, an EPE margin increases.

Although as described above, the method for manufacturing a semiconductor device has been described through the above embodiments, the present disclosure is not limited to the above embodiments, and various modifications and improvements are possible within the scope of the present disclosure.

This application claims the benefit of priority from the basic application No. 2016-059716, filed on Mar. 24, 2016 to the Japan Patent Office, the entire contents of which are incorporated herein by reference.

| Description of Symbols | |
|---|---|
| 102: gate | 104: cap dielectric film |
| 106: first insulating film | 108: sacrifice film |
| 110: protective film | 112: hard mask film |
| 112a: hard mask pattern | 112l: line pattern |
| 112s: space pattern | 114: first opening |
| 116: second insulating film | 118: second opening |
| 120: contact plug | 152: etching mask |
| 154: first cut mask | 156: second cut mask |

What is claimed is:

1. A method for manufacturing a semiconductor device, the method comprising:
    forming a first insulating film to cover both sides of a surface of a gate in a transistor having a structure in which a source and a drain raised in a fin shape are covered with the gate;
    forming a sacrifice film on the first insulating film;
    forming a hard mask film having a desired pattern on the sacrifice film;
    forming a cut mask on the hard mask film;
    removing only a part of the hard mark film by using the cut mask as an etching mask;
    forming a first opening by removing a part of the sacrifice film by using the hard mask film as an etching mask;
    forming a second insulating film made of a material different from the first insulating film, in the first opening;
    forming a second opening by removing the sacrifice film, at a position where at least a part of the source or the drain is electrically connected to a wiring layer, after the forming the second insulating film; and
    forming a contact plug in the second opening,
    wherein, in forming the second insulating film, the second insulating film is formed in the first opening while the first insulating film remains at least at both sides of the gate.

2. The method of claim 1, wherein in the forming the hard mask film, the hard mask film is formed with a line-and-space pattern on the sacrifice film; and
    the desired pattern is formed by cutting out a part of a line pattern of the line-and-space pattern.

3. The method of claim 1, further comprising:
    removing the hard mask film after the forming the second insulating film and before the forming the second opening.

4. The method of claim 1, wherein the hard mask film is a film having a high etching selectivity with respect to the sacrifice film.

5. The method of claim 1, wherein the first insulating film is a SiN film.

6. The method of claim 5, wherein the sacrifice film is an SOC film,
- the second insulating film is an SOD film or a $SiO_2$ film, and
- in the forming the second opening, the sacrifice film is removed by ashing.

7. The method of claim 5, wherein the sacrifice film is an a-Si film,
- the second insulating film is an SOD film or a $Sio_2$ film, and
- in the forming the second opening, the sacrifice film is removed by dry etching using a gas containing chlorine or bromine.

8. The method of claim 5, wherein the sacrifice film is an SOD film,
- the second insulating film is a $Si0_2$ film, and
- in the forming the second opening, the sacrifice film is removed by wet etching.

* * * * *